United States Patent
Greither

(10) Patent No.: US 9,887,694 B2
(45) Date of Patent: Feb. 6, 2018

(54) CONTROL CIRCUIT FOR SOLID STATE POWER CONTROLLER

(71) Applicant: HS Elektronik Systeme GmbH, Nördlingen (DE)

(72) Inventor: Markus Greither, Augsburg (DE)

(73) Assignee: HS ELEKTRONIK SYSTEME GMBH, Nördlingen (DE)

( * ) Notice: Subject to any disclaimer, the term of this patent is extended or adjusted under 35 U.S.C. 154(b) by 0 days.

(21) Appl. No.: 14/996,005

(22) Filed: Jan. 14, 2016

(65) Prior Publication Data
US 2016/0204777 A1  Jul. 14, 2016

(30) Foreign Application Priority Data
Jan. 14, 2015  (DE) .......................... 10 2015 100 482

(51) Int. Cl.
*H03K 17/00*  (2006.01)
*H03K 17/12*  (2006.01)

(52) U.S. Cl.
CPC ................................. *H03K 17/122* (2013.01)

(58) Field of Classification Search
CPC ............... H03K 17/122; H03K 17/693; H03K 17/6872; H03K 17/04123
USPC ........ 327/403–405, 108–112, 427, 434, 437; 326/82, 83, 87; 307/31–33; 323/265–272
See application file for complete search history.

(56) References Cited

U.S. PATENT DOCUMENTS

| | | | |
|---|---|---|---|
| 5,324,989 A | 6/1994 | Thornton | |
| 5,774,000 A * | 6/1998 | Vercellotti | H03K 17/08142 327/110 |
| 2008/0150609 A1* | 6/2008 | Durbaum | H03K 17/0822 327/513 |

FOREIGN PATENT DOCUMENTS

| | | |
|---|---|---|
| DE | 102011006788 A1 | 10/2012 |
| WO | 2005015741 A2 | 2/2005 |

OTHER PUBLICATIONS

Partial European Search Report for Application No. 15202023 Mailed May 19, 2016; 6 Pages.
European Search Report and Written Opinion; International Application No. EP 15 20 2023; dated Oct. 4, 016; 4 pages.

* cited by examiner

*Primary Examiner* — Thomas Skibinski
(74) *Attorney, Agent, or Firm* — Cantor Colburn LLP

(57) ABSTRACT

A control circuit is configured to apply a drive voltage to a solid state switching device comprising a first terminal (D), a second terminal (S) and a control terminal (G), the solid state switching device configured to switch, according to the drive voltage applied to the control terminal (G), between an OFF operation mode in which the second terminal (S) is electrically disconnected from an electrical supply voltage applied to the first terminal (D), and an ON operation mode in which the second terminal (S) is electrically connected to the electrical supply voltage applied to the first terminal (D) such as to connect a load circuit to the electrical supply voltage.

16 Claims, 2 Drawing Sheets

Standard SSPC Application

Paralleled SSPC Application

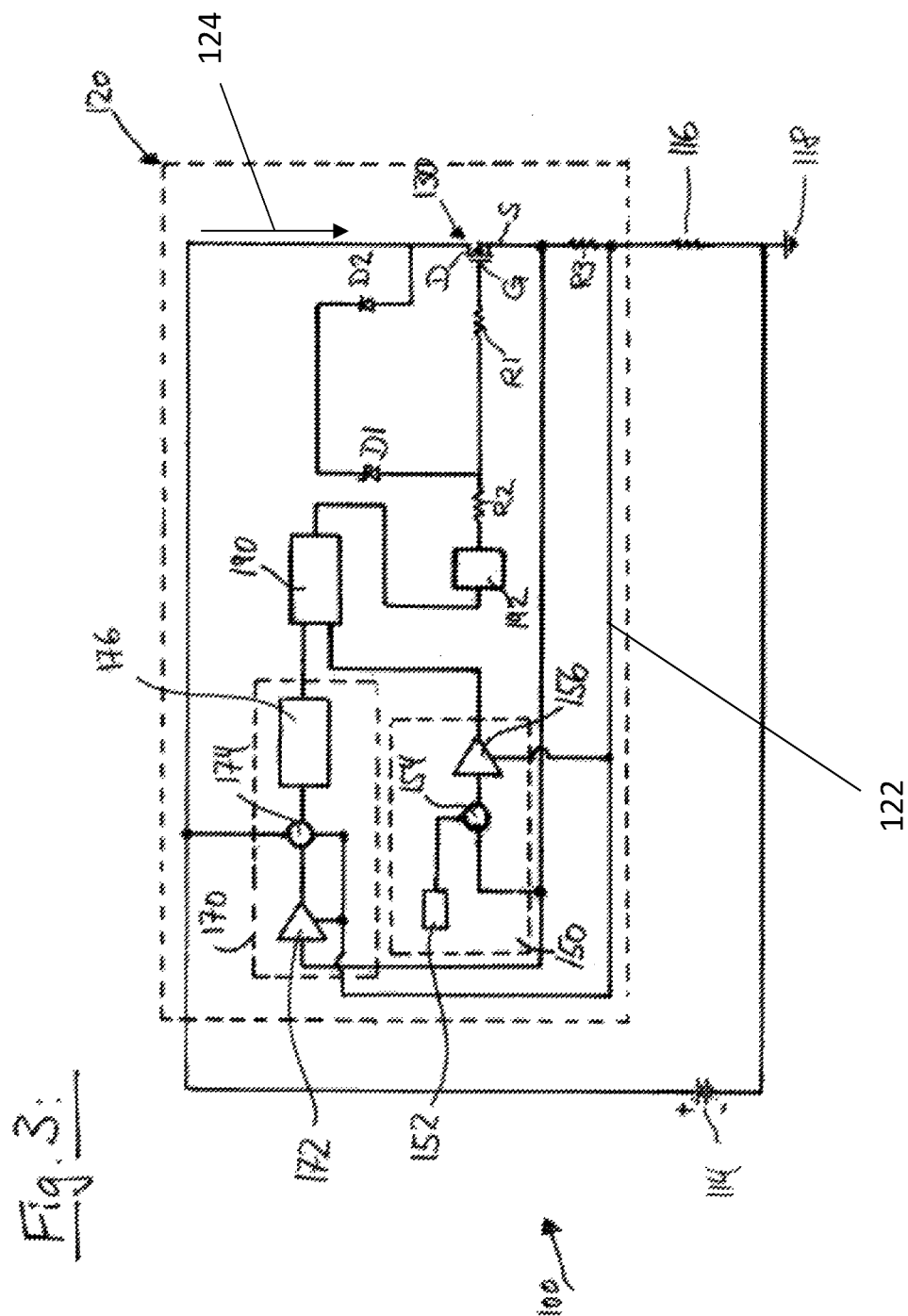

CONTROL CIRCUIT FOR SOLID STATE POWER CONTROLLER

FOREIGN PRIORITY

This application claims priority to European Patent Application No. 10 2015 100 482.8 filed on Jan. 14, 2015, the entire contents of which is incorporated herein by reference.

TECHNICAL FIELD

The present invention relates to a control circuit (or gate drive circuit) for a solid state power controller (in the following referred to as SSPC), as well as to a solid state power controller including such control circuit.

BACKGROUND OF THE INVENTION

Vehicles, such as aircraft, typically utilise one or more power distribution units to distribute power from a primary power source to various vehicle systems. A power distribution unit typically includes at least one electronic switch, such as a FET, and electronic circuitry that provides wiring protection. The electronic switch and circuitry are usually built in semiconductor technology and therefore referred to as a solid state power controller ("SSPC"). SSPC's have found widespread use because of their desirable status capability, reliability, and packaging density. SSPCs are gaining acceptance as a modern alternative to the combination of conventional electromechanical relays and circuit breakers for commercial aircraft power distribution due to their high reliability, "soft" switching characteristics, fast response time, and ability to facilitate advanced load management and other aircraft functions. FIG. 1 shows a schematic of a standard SSPC application in a power distribution system 10 using only one SSPC 12. The electrical power distribution system 10 distributes power (DC power or AC power) from an electrical power generator 14 to a load circuit 16. SSPC 12 is controlled via a control interface 22.

In aerospace, electrical power distribution SSPCs are used to switch the voltage from the power sources (e.g. generators or batteries) to the loads. Historically, these SSPCs are designed for a given current rating (e.g. 3A, 5A, 10A . . . ). While SSPCs with current rating under 15 A have been widely utilised in aircraft secondary distribution systems, power dissipation, voltage drop, and leakage current associated with solid state power switching devices pose challenges for using SSPCs in high voltage applications of aircraft primary distribution systems with higher current ratings.

An approach to provide more flexibility is to allow the paralleling of SSPCs, where the electronic switches contacts are configured such that the SSPCs share the load current. So the SSPCs can be used stand-alone or in parallel dependent on load requirements. This allows achieving larger current ratings using a plurality of SSPCs having a lower current rating connected in parallel. FIG. 2 shows a schematic of a paralleled SSPC application in a power distribution system 10 using two SSPCs 12a and 12b connected in parallel. The electrical power distribution system 10 distributes power (DC power or AC power) from electrical power generator 14 to load circuit 16. SSPC 12a is controlled via a control interface 22a and SSPC 12b is controlled via a control interface 22b. It be understood that the number of SSPCs connected parallel is not limited to two, but may be any number as desired to achieve a desired current rating.

A typical SSPC generally comprises a power section including at least one solid state switching device (SSSD) which performs the primary power ON/OFF switching, and at least one control section, which is responsible for SSSD ON/OFF control and feeder wire protection. A typical power distribution unit may include hundreds or thousands of SSPCs.

While connecting a number or SSPCs in parallel is a good conceptual approach for flexibility, due to a number of technical reasons implementation has turned to be rather difficult. One problem is that the current sharing between the SSPCs connected in parallel is not perfect. This is due to fact that each SSPC has a slightly different switch resistance (because of manufacturing tolerances). Moreover, the SSPCs are mounted on printed circuit boards (PCB) and it has turned out that PCB resistance may be different between individual PCBs. As consequence, the paralleled SSPCs do not provide the double current rating (e.g. 2×5A=10A in case of two paralled SSPC with a current rating of 5A for each individual SSPC). Rather, the maximum current rating will be lower and depend on the actual current balance achieved.

It is desirable to have an SSPC design which allows overcoming the above problems.

SUMMARY

Accordingly, particular embodiments as described herein may include: A control circuit configured to apply a drive voltage to a solid state switching device comprising a first terminal, a second terminal and a control terminal, the solid state switching device configured to switch, according to the drive voltage applied to the control terminal, between an OFF operation mode in which the second terminal is electrically disconnected from an electrical supply voltage applied to the first terminal, and an ON operation mode in which the second terminal is electrically connected to the electrical supply voltage applied to the first terminal such as to connect a load circuit to the electrical supply voltage, wherein the control circuit is configured to adjust the drive voltage during the ON operation mode according to a load current in the load circuit and/or according to a current between the first terminal and the second terminal of the solid state switching device in the ON operation mode.

BRIEF DESCRIPTION OF DRAWINGS

Particular embodiments will now be described, by way of example only, with reference to the drawings.

FIG. 3 is a simplified circuit diagram of an SSPC application in a power distribution system using an SSPC according to an embodiment of the present invention.

DETAILED DESCRIPTION OF THE INVENTION

Figure 1:
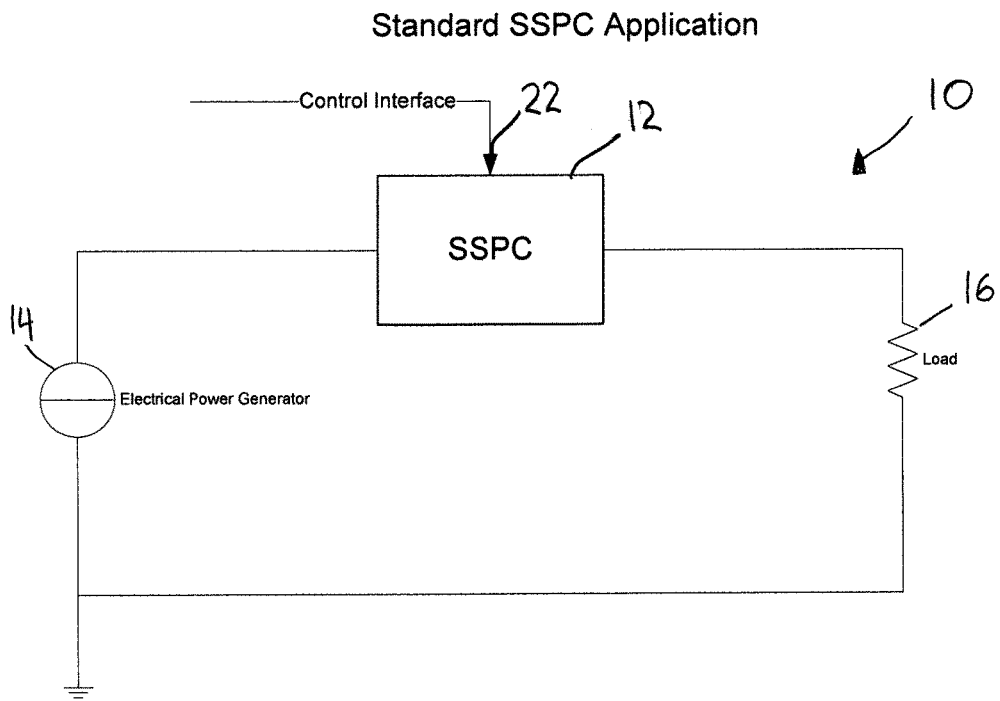
FIG. 1 is a simplified circuit diagram of a standard SSPC application in a power distribution system using only one SSPC.
Figure 2:
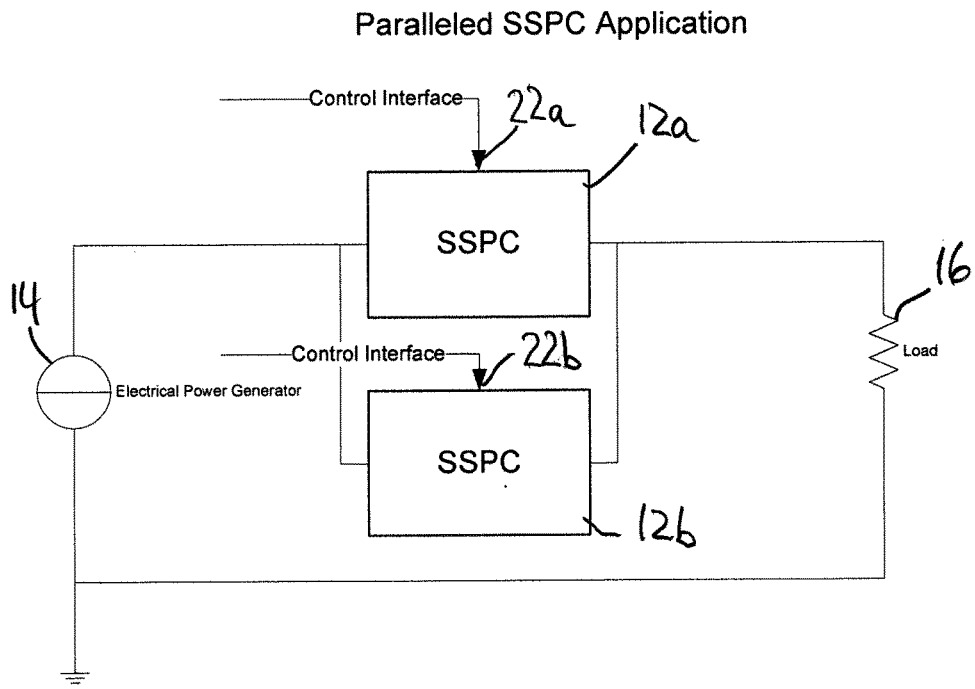
FIG. 2 is a simplified circuit diagram of a paralleled SSPC application in a power distribution system using two SSPCs connected in parallel.

The standard SSPC application as shown in FIG. 1, as well as the basic design of a paralleled SSPC application as shown in FIG. 2, have been described above, as far as relevant to the present invention. Reference is made to the description above.

FIG. 3 shows a simplified circuit diagram of an SSPC application in a power distribution system 100 using an SSPC 120 according to an embodiment of the present invention. The electrical power distribution system 100 distributes power from an electrical power generator 114 to a load circuit 116. SSPC 100 includes a power section for actually switching between an ON operation mode in which a supply voltage provided by power supply 114 is electrically connected to the load circuit 116, and an OFF operation mode in which the supply voltage provided by power supply 114 is disconnected from the load circuit 116. Power section comprises a solid state switching device 130 as described in more detail below. Further, SSPC 120 includes a control section or driver section for controlling ON/OFF operation modes of the SSSD 130. FIG. 3 schematically shows the power section and the control section of the SSPC 120, as far as relevant to the present invention. Other parts of the SSPC 120 are not shown for sake of brevity. Moreover, FIG. 3 only shows those components of the control section and power section of SSPC 120 having relevance for explaining the particular function of the control circuit (in the following the terms control circuit or driver circuit will be used interchangeably, it be understood that these terms are synonyms) as suggested herein, it be understood that usually further components will be included in practical realizations.

In one example, SSSD 130 may have the configuration of a SiC-MOSFET (metal oxide semiconductor field effect transistor). The SiC-MOSFET transistor may made in NMOS technology. Other configurations are conceivable for the SSSD switching device 130 as well, particularly any other kind of switching devices or transistors based on SiC technology. Moreover, SSSD may be any kind of bipolar transistor (e.g. a JFET) or unipolar transistor (e.g. a FET or an IGBT). The gate control circuit suggested herein may be beneficial for other types of SSSD's as well, particularly for Si based switching devices or transistors like Si-MOSFET's or Si-IGBT's. SiC FET's have turned out to be particularly sensitive with respect to thermal loads induced by temperatures increasing above a nominal temperature.

The SSSD 130 includes a first terminal (in the MOSFET of FIG. 3: drain D), a second terminal (in the MOSFET of FIG. 3: source S), and a control terminal (in the MOSFET of FIG. 3: gate G). Depending on a control voltage applied to control terminal (gate G), an electrical path between the first terminal (drain D) and the second terminal (source S)—in the following referred to as "source-drain path"—will be open (ON condition), or closed (OFF condition). When the source-drain path of the SSSD 130 is in the ON condition, usually the source-drain path will be fully open (e.g. the electrical resistance of the source-drain path will be at a minimum), and the SSSD operates in the ON operation mode. When the source-drain path of the SSSD 130 is in the OFF condition, the source-drain path will be closed (e.g. the electrical resistance of the source-drain path will be very large, or even infinity) and the SSSD operates in the OFF operation mode. The first terminal (drain D) of the SSSD 130 is connected to line input as provided by power supply 114, and therefore has the electric potential of the power supply (e.g. 28V in case of a 28V DC power supply, as indicated exemplary in FIG. 3; it be understood that power supply 114 may be any kind of DC or AC power supply). The second terminal (source S) of the SSSD 130 is connected to load circuit 116 (indicated by a resistive load in FIG. 3, however it be understood that load circuit 116 may comprise any combination of ohmic, capacitive and inductive loads).

The control terminal (gate G) of SSSD 130 is connected to a control circuit or driver circuit of the SSPC 120 via a first resistor R1. Control circuit or driver circuit is configured to control electrical potential of gate G. Depending on the electric potential of gate G, the source-drain path of SSSD 130 will be conductive, thereby electrically connecting the first terminal (drain D) with the second terminal (source S) of SSSD 130 ("ON" operation mode of the SSSD), or non-conductive, thereby isolating the first terminal (drain D) from the second terminal (source S) of SSSD 130 ("OFF" operation mode of the SSSD). In the OFF operation mode of the SSSD 130, the second terminal (source S) will be at ground potential (as indicated by 118 in FIG. 3). SSSD 130 is configured to switch between ON operation mode and OFF operation mode. The control circuit of the SSPC 120 will be described in further detail below.

Depending on the electric potential of gate G, SSSD 130 may operate in a transient condition in which the source-drain path of the SSSD 130 will be conductive, but have an electrical resistance larger than the minimum possible electrical resistance of the source-drain path in a condition where the electrical potential of the gate G is sufficient to set SSSD 130 in the ON operation mode. Such transient condition of SSSD 130 is used in the OFF operation mode of the SSSD to dissipate a transient current flowing in the load circuit 116 after the start of a switching OFF operation of the SSSD 130, e.g. in case of an SSPC 120 connected to a load circuit 116 including an inductive load.

First resistor R1 is a conditioning resistor to ensure that the control signal received by the control terminal (gate G) is suitable to control the SSSD 130, e.g. with respect to limiting a charging/discharging current due to an inherent capacity of the control terminal (gate G).

The SSPC 120 according to the embodiment of FIG. 3 also includes a clamping circuit basically made up with a Z-diode D1 connected anti serially to a rectifier diode D2 in between the first terminal (in FIG. 3, drain D) of SSSD 130 and the control terminal (in FIG. 3: gate G) of SSSD 130. The break through voltage of the Z-diode D1 defines a clamping voltage, i.e. the break through voltage of the Z-diode D1 is chosen such as to be well below a critical break through voltage for the source-drain channel of the SSSD 130. Further Z-diodes may be added in series to Z-diodes D1, in order to obtain a sufficiently high clamping voltage as desired. Diode D2 connected in series to Z-diode D1 is a rectifier diode which is oriented anti serial with respect to Z-diode D1, i.e. diode D2 is oriented in forward direction with respect to a current flowing from the first terminal (drain D) to the control terminal (gate G) of SSSD 130, and in blocking direction with regard to a negative voltage, or in case of a short connection of a positive control voltage at the control terminal (gate G) via the drain source channel of the SSSD 130. Diode D2 may be any form of diode as known in the art. Particularly useful are Schottky diodes, as well as TVS diodes or Z diodes having a sufficiently high break through voltage to suppress a short circuit. Such diodes as mentioned before have proven to be beneficial under low operating temperatures because of their fast switching characteristics when operated in forward direction. In case less stringent switching characteristics in forward direction are required (e.g. because of higher operating temperatures), diode D2 may be a normal rectifier diode connected in blocking direction with respect to a positive potential at the control terminal (gate G).

The second terminal (source S) of SSSD 130 is connected to load circuit 116. Although load circuit 116 is indicated by a resistive load, it be understood that in further embodiments, load circuit 116 may include any combination of resistive, capacitive, and inductive loads. Load circuit 116 is connected to ground 118.

An arrangement for detecting a load current in load circuit is indicated by 122 in FIG. 3. Load current detecting arrangement provides for a signal (indicated at 124 in FIG. 3) indicative of the load current in the load circuit 116. For example, load current detecting arrangement 122 may be configured to detect a voltage across a measurement resistor R3 connected in series in the load circuit 116. Other load current detecting arrangements might be used in further embodiments. Load current signal 124 particularly is a voltage signal indicative of the load current.

The control circuit is connected to control terminal (gate G) of SSSD 130 and configured to apply a drive voltage to control terminal G. According to the drive voltage, SSSD 130 switches between an OFF operation mode in which the second terminal (source S) is electrically disconnected from an electrical supply voltage applied to the first terminal (drain D), and an ON operation mode in which the second terminal S is electrically connected to the electrical supply voltage applied to the first terminal D. In the ON operation mode, load circuit 116 is electrically connected to the electrical supply voltage provided by voltage supply 114 (in FIG. 3, an 28 VDC voltage supply 114 is shown, it be understood that voltage supply 114 may be any other DC or AC voltage supply in further embodiments). The control circuit shown in FIG. 3 is configured to adjust the drive voltage in the ON operation mode according to a load current in the load circuit 116.

The control circuit includes a regulation mechanism to adjust the gate drive voltage in the ON condition of the SSSD. Therefore, the gate drive voltage provided by control circuit no longer is a mere digital quantity (i.e. a quantity having only two states representative of the ON operation mode and representative of the OFF operation mode, respectively), but may be adjusted within a certain range, at least in the ON operation mode of the SSSD 130.

The control circuit according to FIG. 3 comprises an ON-Resistance control member 170. ON-Resistance control member 170 comprises amplifying member 172, first subtracting member 174, and inverting and regulating member 176 all connected in series to each other in that order. Load current signal 124 is input to ON-Resistance control member 170, and ON-Resistance control member outputs signal 178 to selection member 190. Selection member 190 is connected to control terminal (gate G) of SSSD 130 via a limiting member 192 and further conditioning resistors R2, R1.

ON-Resistance control member 170 is configured to adjust the drive voltage applied to the control terminal G of the SSSD 130 in the ON operation mode such as to set the ON-Resistance of the SSSD 130 operating in the ON operation mode to a predetermined ON-Resistance value. ON-Resistance of the SSSD 130 is defined by the ratio of the supply voltage applied to the first terminal D of the SSSD 130 and a signal indicative of the drain-source current of the SSSD 130 when operating in the ON operation mode. ON-Resistance control member 170 regulates the gate voltage of the SSSD 130 in such a way that the drain-source voltage of the SSSD 130 and the drain current of the SSSD 130 meet a certain ratio. This allows achieving good load sharing in a configuration of a power distribution system with a plurality of SSPCs 120 having the configuration of the SSPC shown in FIG. 3 connected in parallel, since each SSPC 120 may regulate the ON-Resistance of its SSSD 130 to the same predetermined target ON-Resistance value. Predetermined target ON-Resistance value may be set and controlled by an overall controller of a power distribution system, e.g. in case of a power distribution system including a plurality of SSPCs having the configuration of SSPC 120 according to FIG. 3 connected in parallel.

Amplifying member 172, first subtracting member 174, and inverting and regulating member 176 of the ON-Resistance control member 170 are connected to the control terminal G and to the second terminal S of SSSD 130 to form a feedback loop for regulating the ON-Resistance of the SSSD 130 to predetermined target ON-Resistance value.

First subtraction member 174 has a first input for the voltage applied between the first terminal D and second terminal S of the SSSD 130, and a second input for signal 124 which indicates the source-drain current of the SSSD 130 in the ON operation mode. First subtraction member 174 provides at an output thereof a signal indicative of a difference between the voltage applied between the first terminal D and the second terminal S of SSSD 130 and signal 124 which indicates the source-drain current of the SSSD 130 in the ON operation mode. Amplifying member 172 is connected in between load circuit 116 and the first input of the first subtraction member 176 thereby amplifying the signal 124 delivered by the load current detecting arrangement 122. Signal 124 is representative of the source-drain current in the SSSD 130 in the ON operation mode. Amplifying member 172 adjusts the absolute value of signal 124 to a suitable value with respect to the signal indicative of the voltage applied between the first terminal and the second terminal S of the solid state switching device.

Inverting and regulating member 176 is connected in between the output of the first subtraction member 174 and the control terminal G of SSSD 130 via selection member 190 and limiting member 192. Thereby, inverting and regulating member 176 provides a drive voltage signal corresponding to an inverse of the difference between amplified signal 124 (which indicates the source-drain current of the SSSD 130 in the ON operation mode) and the voltage applied between the first terminal D and the second terminal S.

The feedback control provided by the ON-Resistance control member 170 is based on the difference between the source-drain voltage of the SSSD 130 and the amplified drain current signal 124. The drain current may be detected by load current sensor 122. Therefore, the control provided by the ON-Resistance control member 170 is largely independent of absolute values, particularly of the absolute value of the input voltage. Parameters of the control circuit may be adjusted according to given characteristics of the SSSD 130, independent of input voltage or load characteristics.

It may be conceivable to provide a suitable mechanism for deactivating the ON-Resistance control member 170 in case the drain current or load current is relatively small (e.g. below a minimum threshold current). This avoids interferences or instabilities in the control loop of the ON-Resistance control member 170 caused by measurement inaccuracies which may become significant for small drain current or load current. In case of small drain current or load current, load sharing among a plurality of SSPCs connected in parallel is usually not very critical, so it should be acceptable to deactivate the ON-Resistance control member 170 under such circumstances.

The control circuit according FIG. 3 further comprises a load current limiting member 150. Load current limiting member 150 is configured to reduce, in the ON operation mode of SSSD 130, the drive voltage applied to the control terminal G of SSSD 130 such as to limit the load current in the load circuit 116 to values below a predetermined maximum load current. Load current limiting member 150 provides an active current limit for an overload case, so that there is a defined maximum current for the SSPC 130 independent of the load.

Load current limiting member 150 comprises a second subtraction member 154 and a second amplifying member 156 connected in series to each other. Second subtraction member 154 has a first input for the signal 124 provided by load current detection arrangement 122, and a second input for a signal 160 representing the predetermined maximum load current. Signal 160 representing the predetermined maximum load current is provided by member 152 and may be controlled by an overall control member, e.g. a control interface of a power distribution system. Second sub-traction member 154 provides at an output thereof a signal indicative of a difference between signal 160 representing the predetermined maximum load current and signal 124 representing the actual load current in the ON operation mode of SSSD 124. Thereby load current limiting member 150 is responsive to a difference between signal 160 representing the predermined maximum load current and signal 124 representing the actual load current in the ON-operation mode of SSSD 130. Amplifying member 156 amplifies output of the second subtraction member 154 and supplies the amplified signal 158 to second input of selection member 190.

Load limiting member 150 is configured to be operative only for a short time period after switching SSSD 130 to the ON-operation mode or after the load current has increased above a predetermined threshold value. Predetermined threshold value is selected such that it may be anticipated that load current will increase above maximum load current once load current has reached the predetermined threshold value.

Load current limiting member 150 drives high power dissipation levels to the SSSD 130 when it is activated. Activating load current limiting member 150 only for short time periods avoids much of these power losses by power dissipation in SSSD 130. In any case load current limiting member 150 will be activated long enough to cover any anticipated time delays in turning ON of the paralleled SSPCs.

In case of the load current exceeding the maximum load current, the load current limiting member 150 will be active, i.e. limit any load current exceeding the predetermined maximum load current to the predetermined maximum load current by operating the SSSD 130 in its linear mode. The SSSD 130 is subject to high power dissipation when operated in its linear mode, and hence it can operate in the linear mode only for a limited period of time without suffering damage. Therefore, it may be conceivable to limit active operation of the load current limiting member, (i.e. operation of the load current limiting member in a situation where the load current exceeds the predetermined maximum load current), to an active operation period shorter than, or at maximum equal to, such critical time for damaging the SSSD 130 when operating in the linear mode. For example, a control may be assigned to the load limiting member 150 which switches the SSSD 130 to the OFF operation mode after the load current limiting member 150 has been in the active operation for the predetermined active operation period. Such control may be included in an overall control of a power management system.

The control circuit further comprises selection member 190 having a first input supplied with output signal 178 of ON-Resistance control member 170, and a second input supplied with output signal 158 of the load current limiting member 150. The selection member 190 is configured to supply a signal indicative of the minimum of the signals 178, 158 applied to the first and second inputs thereof as the drive voltage to the control terminal G of SSSD 130. Selection member 190 selects the lower one of the signals 178, 158 provided by the ON-resistance control member 170 and by the load limiting control member 150 as the drive voltage, in order to increase the ON-resistance of SSSD 130 as far as required by any of the ON-Resistance control member 170 and the load current limiting member 150.

A further limiting member 192 is connected in between the output of selection member 190 and control terminal G of SSSD 130, in order to limit the Gate voltages to suitable levels for the SSSD 130 chosen, and also improve the response time.

Signal 124 indicating the load current in the load circuit 116, as well as signal 160 indicating the maximum load current are voltage signals. Hence, output signal 158 of the current limiting member 170 is a voltage signal as well, and may be applied as the drive voltage to control terminal G of SSSD 130. Similarly, output signal 178 of ON-Resistance control member 170 is a voltage signal and may be applied as the drive voltage to control terminal G of SSSD 130.

Particular embodiments as described above may include: A control circuit configured to apply a drive voltage to a solid state switching device comprising a first terminal, a second terminal and a control terminal, the solid state switching device configured to switch, according to the drive voltage applied to the control terminal, between an OFF operation mode in which the second terminal is electrically disconnected from an electrical supply voltage applied to the first terminal, and an ON operation mode in which the second terminal is electrically connected to the electrical supply voltage applied to the first terminal such as to connect a load circuit to the electrical supply voltage, wherein the control circuit is configured to adjust the drive voltage during the ON operation mode according to a load current in the load circuit and/or according to a current between the first terminal and the second terminal of the solid state switching device in the ON operation mode.

The electric path between the first terminal and the second terminal of the semiconductor switching device (in the following also referred to as SSSD) will be referred to as "source-drain path" of the SSSD throughout this disclosure. This denotation is typically used in connection with field effect transistors, however it be understood that the term "source-drain path" as used herein applies to other types of SSSDs as well (e.g. to bipolar transistors where the terms "emitter" and "collector" are commonly used instead of "source" and "drain").

The embodiments described herein provide a different gate drive architecture for providing the drive voltage to the control terminal of the SSSD as compared to the gate drive architecture typically used with SSSDs. Instead of a hard, digital gate drive circuit providing a first gate drive voltage corresponding to an OFF operation mode of the SSSD (source drain path being electrically isolating) and a second gate drive voltage corresponding to an ON operation mode of the SSSD (source drain path being electrically conductive), the embodiments disclosed herein provide for a gate drive architecture having a regulation mechanism implemented therein. Such regulation mechanism allows adjusting the gate drive voltage in the ON condition of the SSSD. Therefore, the gate drive voltage no longer is a digital quantity. Rather, the gate drive voltage may be adjusted within a certain range, at least in the ON operation mode of the SSSD.

Based on this new approach a plurality of solid state power controllers (SSSPCs), each SSSPC including at least one SSSD, may be connected in parallel in a configuration where a good current sharing between these SSPC can be achieved. This can be realized without adding additional parts to the SSPC power section (particularly the SSSD power stages). The control circuit for providing an adjustable drive voltage in the ON operation mode of the SSSD may be integrated in an ASIC, so that no additional component area is added. The control circuit may include a feedback loop, but may as well be implemented in an open loop configuration.

The control circuit suggested herein provides low tolerance trip or turning ON thresholds even when a plurality of SSPCs are connected in parallel in a power distribution system, in contrast to parallel SSPC solutions in the prior art. The gate drive architecture having a regulation mechanism as suggested herein allows an almost perfectly synchronized turning ON of all SSPCs connected in parallel, even in cases where the SSSD's included in the plurality of SSPCs are subject to significant manufacturing tolerances.

Moreover, an overall control of the power distribution system (which may implemented as a an overall regulation loop) may then be configured to optimize the electrical ON-Resistance of the SSSDs connected in parallel. The term ON-Resistance as used herein refers to the electrical resistance of the source-drain path of the SSSD when operating in the ON operation mode. Thereby, good current sharing with minimum possible ON-Resistances can be achieved even for configuration with multiple SSPCs connected in parallel.

Further embodiments may include any of the following optional features, alone or in combination:

The solid state switching device may comprise a source-drain path being electrically conductive in the ON operation mode. The control circuit may be configured to reduce, in the ON operation mode, the drive voltage applied to the control terminal of the solid state switching device with respect to a drive voltage required to make the source-drain path of the solid state switching device fully conductive (in the digital control circuits used in the prior art such drive voltage would be referred to as the ON operation drive voltage, i.e. the drive voltage required to minimize the electrical drain-gate resistance of the solid state switching device). Particularly, the control circuit according to the embodiments disclosed herein may be configured to reduce the drive voltage according to the load current detected in the load circuit in the ON operation mode. Such load current may be used as a measure of the source-drain current of the SSSD in the ON operation mode.

The control circuit may comprise an ON-Resistance control member configured to adjust the drive voltage applied to the control terminal of the solid state switching device in the ON operation mode such as to set the ON-Resistance of the solid state switching device operating in the ON operation mode to a predetermined ON-Resistance.

The ON-Resistance of the solid state switching device operating in the ON operation mode is defined by the ratio of the voltage applied between the first terminal (e.g. drain D) and second terminal (e.g. source S) of the solid state switching device and a signal indicative of the drain-source current of the solid state switching device when operating in the ON operation mode. ON operation mode refers to a condition where the source-drain path is electrically conductive. Instead of providing a fixed drive control voltage corresponding to a minimum ON-Resistance of the source-drain path, as done in the prior art, the ON-Resistance control member adjusts the drive control voltage in the ON operation mode and thereby typically will increase the ON-Resistance of the source-drain path with respect to the minimum ON-Resistance in the ON operation mode. The ON-Resistance control member operates for load currents below the load current limit value (which corresponds to a maximum allowable load current, as outlined in more detail below). It regulates the gate voltage of the SSSD so that the SSSD drain-source voltage and its drain current meets a certain ratio, which defines the ON-Resistance of the SSSD. In a configuration of a power distribution system with a plurality of SSPCs connected in parallel, each SSPC may regulate the ON-Resistance of its SSSD to a preset ON-Resistance value. Good current sharing among the SSPCs may be achieved, since all SSSDs may adjust precisely the same ON-Resistance. For stand-alone applications, this feature might be disabled to achieve the full performance of the SSSD.

The ON-Resistance control member may comprise a feedback loop for regulating the ON-Resistance of the solid state switching device to a predetermined target ON-Resistance value.

The ON-Resistance control member may comprise a first subtraction member providing at an output thereof a signal indicative of a difference between the voltage applied between the first and second terminal of the solid state switching device and a signal indicative of the source-drain current of the solid-state switching device in the ON operation mode.

The first subtraction member may have a first input for the voltage applied between the first and second terminal of the solid state switching device, and a second input for a signal indicative of the source-drain current of the solid-state switching device in the ON operation mode. The signal indicative of the source-drain current of the solid-state switching device in the ON operation mode may be detected a in the load circuit, e.g. by a load current sensor.

The ON-Resistance control member further may comprise an inverting and regulating member connected in between the output of the first subtraction member and the control terminal of the solid state switching device.

The inverting and regulating member may be connected in series with the first subtraction member and "downstream" of the first subtraction member. It provides an inverted signal with respect to the difference signal delivered by the first subtraction member. Consequently, the inverted signal is large in case the difference signal is small (which indicates that the ON-Resistance of the solid state switching device is close to the predetermined target ON-resistance value), and the inverted signal is small in case the difference signal is large (which indicates that the ON-Resistance of the solid state switching device is significantly smaller than the predetermined target ON-resistance value). The inverted signal is delivered to the control terminal of the solid state switching device, and thus a reduction of the inverted signal will cause a reduction of the drive voltage and a corresponding increase in the ON-Resistance of the solid state switching device. In consequence, in case the ON-Resistance of the solid state switching device is significantly smaller than the predetermined target ON-Resistance value, the feedback control loop implemented by the ON-Resistance control member increases the ON-Resistance of the solid state switching device iteratively until the ON-Resistance of the solid state switching device approaches the predetermined target ON-resistance value sufficiently closely. For optimized dynamic performance, the inverting and regulating member will be designed as regulation element, e.g. with a PI characteristics.

The ON-Resistance control member further may comprise an amplifying member connected in between the second terminal of the solid state switching device and the input of the first subtraction member.

The amplifying member allows adjusting a gain of the signal representing the source-drain current of the solid state switching device in the ON operation mode (e.g. the signal delivered by a load current sensor) to a suitable value with respect to the signal indicative of the supply voltage applied to the first terminal of the solid state switching device.

The control circuit further may comprise a load current limiting member configured to reduce, in the ON operation mode of the solid state switching device, the drive voltage applied to the control terminal of the solid state switching device such as to limit the load current in the load circuit to values below a predetermined threshold load current.

The load current limiting member provides an active current limit for an overload case, so that there is a defined maximum current for the SSPC independent of the load. For a power distribution system having a configuration with a plurality of SSPCs connected in parallel, each SSPC may set the same threshold load current and thereby limit their load currents to values at or below the same threshold current value to achieve good current sharing among the SSPCs. This feature allows also small time delays in turning-ON of the paralleled SSPCs without a nuisance trip off, as it would happen in a traditional SSPC with so called fast instantaneous trip protection.

The load current limiting member may comprise a second subtraction member providing at an output thereof a signal indicative of a difference between a predetermined threshold load current and a signal representing the actual load current in the ON operation mode of the solid state switching device.

The load current limiting member may be responsive to a difference between a signal representing the predetermined threshold load current and a signal representing the actual load current in the ON-operation mode of the solid state switching device, i.e. the load current detected while the solid state switching device is operating in the ON-operation mode.

The load current limiting member further may comprise a second amplifying member connected in between an output of the second subtraction member and the control terminal of the solid state switching device.

It may be conceivable to activate the load current limiting member only for short time periods, e.g. after switching to the ON operation mode (in order to effectively suppress large surge currents) or in situations where the load current increases above a predetermined threshold value. Typically such time periods should be as short as possible, but long enough to cover any anticipated time delays in tripping (turning ON) of the paralleled SSPCs. The load current limiting member drives high power dissipation levels to the SSSD when it is activated, and thereby leads to significant losses by power dissipation in the solid state switching device when operating the solid state switching device in the ON-operation mode. Such losses may be avoided by keeping the time where the current limiting member is operative small. Hence it may be conceivable to inactivate this feature in the ON operation mode of the SSSD, unless it is anticipated that the load current will increase beyond the maximum allowable threshold current.

The signal representing the actual load current in the ON operation mode of the solid state switching device and/or the signal indicative of the source-drain current of the solid-state switching device in the ON operation mode may be detected by a current sensor connected at the second terminal of the solid state switching device or connected in the load circuit. The current sensor may e.g. detect a voltage drop across a detecting resistor connected serially in the load circuit.

The control circuit further may comprise a selection member having a first input connected to the output of the ON-Resistance control member and a second input connected to the output of the load current limiting member, the selection member being configured to supply a signal indicative of the minimum of the signals applied to the first and second inputs thereof as the drive voltage to the control terminal of the solid state switching device.

The lower of the signals provided by the ON-resistance control member and by the load limiting control member is selected as the drive voltage, in order to increase the ON-resistance of the solid state switching device (thereby decreasing the source-drain current and the load current in the load circuit) as far as required by any of the ON-Resistance control member and the load current limiting member.

A further limiting member may by connected in between the selection member and the control terminal of the solid state switching device, in order to limit the drive signals suitable to the SSSD and improve dynamic performance.

Further embodiment may include a solid state power controller comprising at least one solid state switching device as described above, and any one of the embodiments of the control circuit described herein.

The solid state switching device may comprise a field effect transistor, particularly a metal oxide semiconductor field effect transistor (MOSFET). For example, the field effect transistor may comprise a SiC field effect transistor. With a field effect transistor, the first terminal will be drain, the second terminal will be source, and the control terminal will be gate. Drain may be connected to the supply voltage and source may be connected to the load circuit. A field effect transistor features easy control. Moreover, MOSFETs have a bi-directional conduction characteristic, a resistive conduction nature, and a positive temperature coefficient. To increase the current carrying capability and reduce the voltage drop or power dissipation, the SSSD may comprise multiple MOSFETs generally connected in parallel.

The field effect transistor may comprise a SiC field effect transistor as a basic solid state component for building up the solid state switching device. SiC based SSSDs can be operated at elevated temperatures up to 175° C. Junction Temperature and for switching high line input voltages up to 1200 V.

The SSSD may be used for switching DC loads as well as AC loads. Typical line input voltages VLINE may include 115 VAC; 230 VAC; 28 VDC (as shown in FIG. 3); or 270 VDC. Maximum currents in the load circuit to be switched may include 5 A; 10 A; 15 A; and may be as high as 45 A.

Further embodiments may relate to a power distribution system comprising at least one solid state power controller as disclosed herein. Particularly, the power distribution system may comprise a plurality of solid state power controllers connected in parallel.

The power distribution system further may comprise a control interface configured to adjust the ON-Resistance target value for each of the solid state switching devices.

Optionally, the ON-Resistance regulation target value can be made flexible and adjustable on the control Interface of the power distribution system, so that the controller commanding the paralleled SSPCs of the power distribution system can provide a suitable control for regulating the ON-Resistance target value to the lowest value which still achieves the required level of current balancing (e.g. by iteratively lowering the ON-Resistance target value until the output current difference between the SSPCs increases to a given maximum value). Such approach achieves the lowest possible ON-Resistance for the configuration of the power distribution system, and therefore provides for the lowest losses of the power distribution system. No extra hardware will be needed, since in a typical application the SSPC currents are reported to the controller anyway. As a result, a flexible yet highly performance optimized SSPC power distribution concept will be available, as needed in today's aerospace distribution systems.

In a further embodiment, the present invention may provide a method for controlling a drive voltage to applied to a solid state switching device comprising a first terminal, a second terminal and a control terminal, the solid state switching device configured to switch, according to the drive voltage applied to the control terminal, between an OFF operation mode in which the second terminal is electrically disconnected from an electrical supply voltage applied to the first terminal, and an ON operation mode in which the second terminal is electrically connected to the electrical supply voltage applied to the first terminal such as to connect a load circuit to the electrical supply voltage, wherein the drive voltage is adjusted during the ON operation mode according to a load current in the load circuit and/or according to a source-drain current of the solid state switching device in the ON operation mode.

The invention claimed is:

1. A control circuit configured to apply a drive voltage to a solid state switching device comprising a first terminal (D), a second terminal (S) and a control terminal (G), the solid state switching device configured to switch, according to the drive voltage applied to the control terminal (G), between an OFF operation mode in which the second terminal (S) is electrically disconnected from an electrical supply voltage applied to the first terminal (D), and an ON operation mode in which the second terminal (S) is electrically connected to the electrical supply voltage applied to the first terminal (D) such as to connect a load circuit to the electrical supply voltage,
wherein the control circuit is configured to adjust the drive voltage during the ON operation mode according to a load current in the load circuit and/or according to a current between the first terminal (D) and the second terminal (S) of the solid state switching device in the ON operation mode;
including a load current limiting member configured to reduce, in the ON operation mode of the solid state switching device, the drive voltage applied to the control terminal (G) of the solid state switching device such as to limit the load current in the load circuit to values below a predetermined maximum load current;
wherein the load current limiting member is configured to be operative only for a short time period after switching the solid state switching device to the ON-operation mode.

2. The control circuit according to claim 1, comprising an ON-Resistance control member configured to adjust the drive voltage applied to the control terminal (G) of the solid state switching device in the ON operation mode such as to set the ON-Resistance of the solid state switching device operating in the ON operation mode to a predetermined ON-Resistance.

3. The control circuit according to claim 2, wherein the ON-Resistance control member comprises a feedback loop for regulating the ON-Resistance of the solid state switching device to a predetermined target ON-Resistance value.

4. The control circuit according to claim 2, wherein the ON-Resistance control member comprises a first subtraction member providing at an output thereof a signal indicative of a difference between the voltage applied between the first terminal (D) and the second terminal (S) of the solid state switching device and a signal indicative of the source-drain current of the solid-state switching device in the ON operation mode.

5. The control circuit according to claim 4, wherein the ON-Resistance control member further comprises an inverting member connected in between the output of the first subtraction member and the control terminal (G) of the solid state switching device.

6. The control circuit according to claim 4, wherein the ON-Resistance control member further comprises an amplifying member connected in between the second terminal (D) of the solid state switching device and the input of the first subtraction member.

7. The control circuit according to claim 2, further comprising a selection member having a first input connected to the output of the ON-Resistance control member and a second input connected to the output of the load current limiting member, the selection member being configured to supply a signal indicative of the minimum of the signals applied to the first and second inputs thereof as the drive voltage to the control terminal (G) of the solid state switching device.

8. The control circuit according to claim 1, wherein the load current limiting member comprises a second subtraction member providing at an output thereof a signal indicative of a difference between a predetermined threshold load current and a signal representing the actual load current in the ON operation mode of the solid state switching device.

9. The control circuit according to claim 1, wherein the load current limiting member further comprises a second amplifying member connected in between an output of the second subtraction member and the control terminal (G) of the solid state switching device.

10. The control circuit according to claim 1, wherein the load limiting member is configured to be operative for a short time period after the load current has increased above a predetermined threshold value.

11. A solid state power controller comprising at least one solid state switching device, and the control circuit according to claim 1.

12. A power distribution system comprising at least one solid state power controller according to claim 11.

13. The power distribution system according to claim 12, comprising a plurality of solid state power controllers connected in parallel.

14. The power distribution system according to claim 12, further comprising a control interface configured to adjust an ON-Resistance target value for each of the solid state switching devices.

15. A control circuit configured to apply a drive voltage to a solid state switching device comprising a first terminal (D), a second terminal (S) and a control terminal (G), the solid state switching device configured to switch, according to the drive voltage applied to the control terminal (G), between an OFF operation mode in which the second terminal (S) is electrically disconnected from an electrical supply voltage applied to the first terminal (D), and an ON operation mode in which the second terminal (S) is electrically connected to the electrical supply voltage applied to the first terminal (D) such as to connect a load circuit to the electrical supply voltage, wherein the control circuit is configured to adjust the drive voltage during the ON operation mode according to a load current in the load circuit and/or according to a current between the first terminal (D) and the second terminal (S) of the solid state switching device in the ON operation mode;

an ON-Resistance control member configured to adjust the drive voltage applied to the control terminal (G) of the solid state switching device in the ON operation mode such as to set the ON-Resistance of the solid state switching device operating in the ON operation mode to a predetermined ON-Resistance; and a selection member having a first input connected to the output of the ON-Resistance control member and a second input connected to the output of a load current limiting member, the selection member being configured to supply a signal indicative of the minimum of the signals applied to the first and second inputs thereof as the drive voltage to the control terminal (G) of the solid state switching device.

16. The control circuit of claim 15, further comprising the load current limiting member configured to reduce, in the ON operation mode of the solid state switching device, the drive voltage applied to the control terminal (G) of the solid state switching device such as to limit the load current in the load circuit to values below a predetermined maximum load current.

* * * * *